United States Patent
Pugh et al.

(10) Patent No.: US 12,034,446 B2
(45) Date of Patent: Jul. 9, 2024

(54) FUSED MEMORY AND ARITHMETIC CIRCUIT

(71) Applicant: Achronix Semiconductor Corporation, Santa Clara, CA (US)

(72) Inventors: Daniel Pugh, Los Gatos, CA (US); Raymond Nijssen, San Jose, CA (US); Michael Philip Fitton, Menlo Park, CA (US)

(73) Assignee: Achronix Semiconductor Corporation, Santa Clara, CA (US)

( * ) Notice: Subject to any disclaimer, the term of this patent is extended or adjusted under 35 U.S.C. 154(b) by 477 days.

(21) Appl. No.: 16/940,878

(22) Filed: Jul. 28, 2020

(65) Prior Publication Data

US 2020/0373925 A1     Nov. 26, 2020

Related U.S. Application Data

(63) Continuation of application No. 16/417,152, filed on May 20, 2019, now Pat. No. 10,790,830.

(51) Int. Cl.
*H03K 19/1776*     (2020.01)
*H03K 19/17736*    (2020.01)

(52) U.S. Cl.
CPC ... *H03K 19/1776* (2013.01); *H03K 19/17744* (2013.01)

(58) Field of Classification Search
CPC .................. H03K 19/1776; H03K 19/17744
See application file for complete search history.

(56) References Cited

U.S. PATENT DOCUMENTS

| 5,517,611 A | 5/1996 | Deering |
| 5,682,107 A | 10/1997 | Tavana et al. |

(Continued)

FOREIGN PATENT DOCUMENTS

| CN | 104969208 | 10/2015 |
| CN | 106168898 | 11/2016 |

(Continued)

OTHER PUBLICATIONS

"International Application Serial No. PCT US2020 043413, International Search Report dated Oct. 30, 2020", 2 pgs.

(Continued)

*Primary Examiner* — Daniel D Chang
(74) *Attorney, Agent, or Firm* — Schwegman Lundberg & Woessner, P.A.

(57) ABSTRACT

A tile of an FPGA fuses memory and arithmetic circuits. Connections directly between multiple instances of the tile are also available, allowing multiple tiles to be treated as larger memories or arithmetic circuits. By using these connections, referred to as cascade inputs and outputs, the input and output bandwidth of the arithmetic circuit is further increased. The arithmetic unit accesses inputs from a combination of: the switch fabric, the memory circuit, a second memory circuit of the tile, and a cascade input. In some example embodiments, the routing of the connections on the tile is based on post-fabrication configuration. In one configuration, all connections are used by the memory circuit, allowing for higher bandwidth in writing or reading the memory. In another configuration, all connections are used by the arithmetic circuit.

20 Claims, 11 Drawing Sheets

(56) References Cited

U.S. PATENT DOCUMENTS

| | | | |
|---|---|---|---|
| 5,983,256 | A | 11/1999 | Peleg et al. |
| 6,362,650 | B1 | 3/2002 | New et al. |
| 6,573,749 | B2 | 6/2003 | New et al. |
| 6,803,786 | B1* | 10/2004 | Bilski ................ G06F 15/7867 326/38 |
| 7,015,719 | B1 | 3/2006 | Feng et al. |
| 7,119,576 | B1 | 10/2006 | Langhammer et al. |
| 7,167,022 | B1* | 1/2007 | Schleicher ....... H03K 19/17728 326/41 |
| 7,185,309 | B1* | 2/2007 | Kulkarni ............... G06F 30/331 716/104 |
| 7,840,628 | B2 | 11/2010 | Kurd |
| 8,041,759 | B1 | 10/2011 | Langhammer et al. |
| 8,539,011 | B1 | 9/2013 | Taylor |
| 9,164,728 | B1 | 10/2015 | Langhammer |
| 9,778,905 | B1 | 10/2017 | Walke |
| 10,673,438 | B1 | 6/2020 | Elkins et al. |
| 10,732,932 | B2 | 8/2020 | Pasca et al. |
| 10,790,830 | B1 | 9/2020 | Pugh et al. |
| 10,831,445 | B1 | 11/2020 | Clark |
| 11,256,476 | B2 | 2/2022 | Pugh et al. |
| 11,650,792 | B2 | 5/2023 | Pugh et al. |
| 2004/0178818 | A1 | 9/2004 | Crotty et al. |
| 2005/0144210 | A1 | 6/2005 | Simkins et al. |
| 2006/0101244 | A1 | 5/2006 | Siu et al. |
| 2007/0063732 | A1* | 3/2007 | Kaptanoglu ....... H03K 19/1737 326/40 |
| 2008/0042687 | A1 | 2/2008 | Mori et al. |
| 2009/0243652 | A1* | 10/2009 | Dorairaj ........... H03K 19/17728 326/38 |
| 2014/0188968 | A1 | 7/2014 | Kaul et al. |
| 2015/0169289 | A1 | 6/2015 | Tannenbaum et al. |
| 2015/0178085 | A1 | 6/2015 | Hertzberg et al. |
| 2015/0199173 | A1 | 7/2015 | Lutz et al. |
| 2016/0124710 | A1 | 5/2016 | Lutz et al. |
| 2016/0211862 | A1 | 7/2016 | Ho et al. |
| 2016/0322084 | A1* | 11/2016 | Wang ....................... G11C 7/22 |
| 2019/0340489 | A1 | 11/2019 | Mills |
| 2021/0042087 | A1 | 2/2021 | Pugh et al. |
| 2021/0263993 | A1 | 8/2021 | Urbanski et al. |
| 2022/0129244 | A1 | 4/2022 | Pugh et al. |
| 2023/0244446 | A1 | 8/2023 | Pugh et al. |

FOREIGN PATENT DOCUMENTS

| | | |
|---|---|---|
| CN | 107168678 | 9/2017 |
| CN | 108255777 | 7/2018 |
| CN | 108459840 | 8/2018 |
| CN | 114128148 | 3/2022 |
| CN | 114402289 | 4/2022 |
| CN | 114128148 | 3/2023 |
| CN | 114402289 | 4/2023 |
| CN | 116248112 | 6/2023 |
| CN | 116450084 | 7/2023 |
| EP | 4010796 | 1/2024 |
| WO | WO-2020067908 A1 | 4/2020 |
| WO | 2020236252 | 11/2020 |
| WO | WO-2021025871 A1 | 2/2021 |

OTHER PUBLICATIONS

"International Application Serial No. PCT US2020 043413, Written Opinion dated Oct. 30, 2020", 5 pgs.

U.S. Appl. No. 16/417,152, filed May 20, 2019, Fused Memory and Arithmetic Circuit.

U.S. Appl. No. 16/535,878, filed Aug. 8, 2019, Multiple Mode Arithmetic Circuit.

"U.S. Appl. No. 16/417,152, Non Final Office Action dated Feb. 5, 2020", 7 pgs.

"U.S. Appl. No. 16/417,152, Notice of Allowance dated May 13, 2020", 6 pgs.

"U.S. Appl. No. 16/417,152, Response filed Apr. 30, 2020 to Non Final Office Action dated Feb. 5, 2020", 13 pgs.

"International Application Serial No. PCT/US2020/023796, International Search Report dated Apr. 14, 2020", 2 pgs.

"International Application Serial No. PCT/US2020/023796, Written Opinion dated Apr. 14, 2020", 4 pgs.

"U.S. Appl. No. 16/535,878, Non Final Office Action dated Aug. 4, 2021", 18 pgs.

"U.S. Appl. No. 16/535,878, Response filed Sep. 16, 2021 to Non Final Office Action dated Aug. 4, 2021", 12 pgs.

Thapliyal, H, et al., "Combined Integer and Floating Point Multiplication Architecture(CIFM) for FPGAs and Its Reversible Logic Implementation", 49th IEEE International Midwest Symposium on Circuits and Systems, (2006), 438-442.

"U.S. Appl. No. 16/535,878, Corrected Notice of Allowability dated Jan. 21, 2022", 2 pgs.

"International Application Serial No. PCT US2020 043413, International Preliminary Report on Patentability dated Feb. 17, 2022", 7 pgs.

"European Application Serial No. 20809410.2, Extended European Search Report dated May 16, 2022", 9 pgs.

"Chinese Application Serial No. 202080052416.1, Office Action dated Jun. 27, 2022", W English Translation, 18 pgs.

"Chinese Application Serial No. 202080064242.0, Voluntary Amendment filed Aug. 17, 2022", w English claims, 19 pgs.

"European Application Serial No. 20849068.0, Extended European Search Report dated Sep. 9, 2022", 10 pgs.

"Chinese Application Serial No. 202080052416.1, Response filed Sep. 30, 2022 to Office Action dated Jun. 27, 2022", w English claims, 17 pgs.

"Chinese Application Serial No. 202080064242.0, Office Action dated Sep. 27, 2022", w English Translation, 14 pgs.

"U.S. Appl. No. 17/569,801, Notice of Allowance dated Jan. 10, 2023", 12 pgs.

"European Application Serial No. 20849068.0, Response filed Feb. 20, 2023 to Extended European Search Report dated Sep. 9, 2022", 16 pgs.

"European Application Serial No. 20809410.2, Response file Nov. 29, 2022 to Extended European Search Report dated May 16, 2022", 16 pgs.

"U.S. Appl. No. 17/569,801, Corrected Notice of Allowability dated Apr. 7, 2023", 2 pgs.

"U.S. Appl. No. 18/125,190, Non Final Office Action dated Nov. 24, 2023", 11 pgs.

"U.S. Appl. No. 18/125,190, Response filed Jan. 11, 2024 to Non Final Office Action dated Nov. 24, 2023", 9 pgs.

"U.S. Appl. No. 18/125,190, Notice of Allowance dated Feb. 5, 2024", 8 pgs.

"European Application Serial No. 23207553.1, Extended European Search Report dated Feb. 19, 2024", 9 Pgs.

* cited by examiner

US 12,034,446 B2

FUSED MEMORY AND ARITHMETIC CIRCUIT

PRIORITY CLAIM

This application claims priority to U.S. patent application Ser. No. 16/417,152, filed May 20, 2019, which is incorporated herein by reference in its entirety.

BACKGROUND

A field programmable gate array (FPGA) is composed of an array of programmable logic blocks that are interconnected with a reconfigurable routing network. Logic blocks vary in type and typically include reconfigurable logic, memories, and arithmetic logic. Reconfigurable logic is commonly implemented with lookup tables.

The reconfigurable routing network can be programmed to connect the logic blocks together in one of many possible configurations. This programmability comes at a cost. The routing network is typically less dense and supports less data than arithmetic logic blocks for a given area. As a result, the practical size/width of an arithmetic logic block is limited by the number of available inputs and outputs provided by the routing network. Although larger arithmetic operations can be achieved by cascading smaller arithmetic logic blocks, this approach introduces unnecessary latency and significantly reduces the overall logic density of an application.

BRIEF DESCRIPTION OF THE DRAWINGS

Some embodiments of the disclosed technology are illustrated by way of example and not limitation in the figures of the accompanying drawings.

DETAILED DESCRIPTION

Example methods, systems and circuits for a fused memory and arithmetic circuit will now be described. In the following description, numerous examples having example-specific details are set forth to provide an understanding of example embodiments. It will be evident, however, to one of ordinary skill in the art that these examples may be practiced without these example-specific details, and/or with different combinations of the details than are given here. Thus, specific embodiments are given for the purpose of simplified explanation, and not limitation.

A tile of an FPGA fuses memory and arithmetic circuits. Connections directly between multiple instances of the tile are also available, allowing multiple tiles to be treated as larger memories or arithmetic circuits. By using these connections, referred to as cascade inputs and outputs, the input and output bandwidth of the arithmetic circuit is further increased.

The total number of connections between the tile and the switch fabric are unchanged and are divided between the memory circuit and the arithmetic circuit. The arithmetic unit accesses inputs from a combination of: the switch fabric, the memory circuit, a second memory circuit of the tile, and a cascade input. In some example embodiments, the routing of the connections on the tile is based on post-fabrication configuration. In one configuration, all connections are used by the memory circuit, allowing for higher bandwidth in writing or reading the memory. In another configuration, all connections are used by the arithmetic circuit.

By fusing memory and arithmetic circuits on a single tile of an FPGA, the bandwidth of the data transfer from the memory to the arithmetic circuit is increased in comparison to prior art implementations in which data is transferred from a memory circuit to an arithmetic circuit via a switch fabric of the FPGA.

Figure 1:
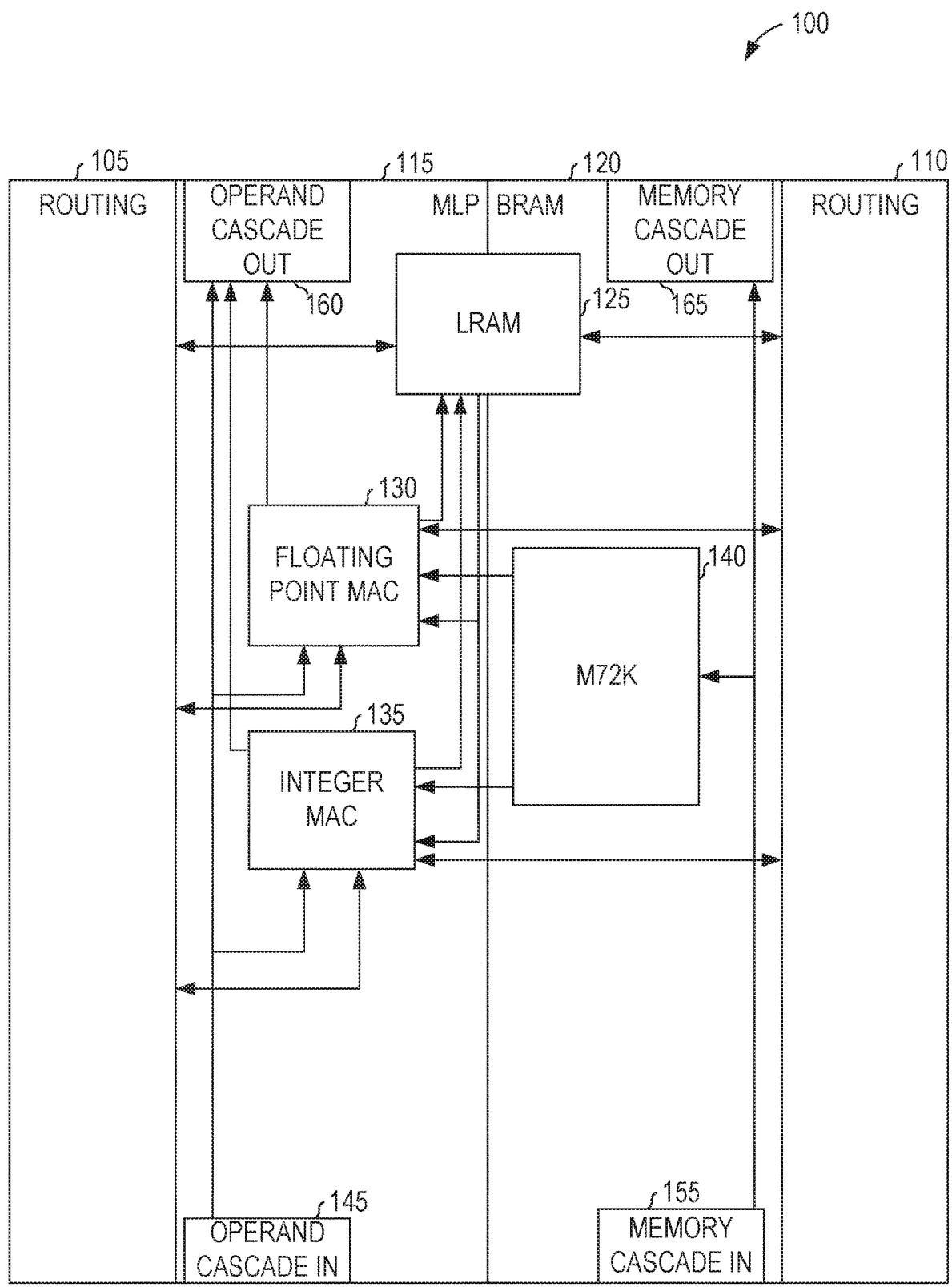
FIG. 1 is a high-level diagrammatic view of a tile of an FPGA that fuses memory and arithmetic circuits, according to some example embodiments.

FIG. 1 is a high-level diagrammatic view of a tile 100 of an FPGA along with connected routing 105 and 110. The tile 100 fuses memory and arithmetic circuits and comprises a machine-learning processor (MLP) 115, a block random access memory (BRAM) 120, and a logic random access memory (LRAM) 125. The MLP 115 comprises a floating point multiply and accumulate (MAC) 130 and an integer MAC 135. The BRAM 120 comprises a memory 140. The tile 100 is connected to other tiles via the routing 105 and the routing 110. Additionally, the tile 100 is directly connected to a first FPGA tile without using a routing connection of the FPGA via the operand cascade input 145 and the memory cascade input 155. The tile 100 is further directly connected to a second FPGA tile without using the routing of the FPGA via the operand cascade output 160 and the memory cascade output 165. The cascade connections may be unidirectional or bidirectional.

In a first operation mode, the MACs 130 and 135 receive inputs from one or more of the routing 105, the LRAM 125, the memory 140, and an operand cascade input 145. Outputs are provided by the MACs 130 and 135 to the routing 105, an operand cascade output 160, the LRAM 125, or any suitable combination thereof. The memory 140 receives input from the routing 110, a memory cascade input 155, or both. Outputs are provided by the memory 140 to the routing 110, a memory cascade output 165, or both. In the first operation mode, the MACs 130 and 135 do not receive input from the routing 110 and the memory 140 does not receive input from the routing 105. Thus, the inputs from the routing fabric of the FPGA are divided between the MLP 115 and the BRAM 120, and the MLP 115 accesses data from the BRAM 120 within the tile 100, without going through the switch fabric.

A typical MAC multiplies two products and adds the results to an accumulator. The MACs 130 and 135, in some example embodiments, provide additional functionality by allowing partial products to be summed and provided as an output before being added to the accumulator. Thus, the individual partial products, sums of partial products for a current multiplication, and an accumulation result across multiple multiplication cycles may all be accessed by use of the MACs 130 and 135.

In a second operation mode, the MACs 130 and 135 receive inputs from one or more of the routing 105, the routing 110, the LRAM 125, and the operand cascade input 145. Outputs are provided by the MACs 130 and 135 to the routing 105, the routing 110, the operand cascade output 160, the LRAM 125, or any suitable combination thereof. In the second operation mode, the memory 140 does not receive inputs from the routing 105 or the routing 110. Thus, in the second operation mode, the tile 100 operates as a dedicated MLP, with MLP 115 having full access to the routing fabric of the FPGA and the memory 140 effectively disabled. Nonetheless, the LRAM 125 may make use of some routing connections in the second operation mode.

In a third operation mode, the memory 140 receives input from the routing 105, the routing 110, the memory cascade input 155, or any suitable combination thereof. Outputs are provided by the memory 140 to the routing 105, the routing 110, the memory cascade output 165, or any suitable combination thereof. In the third operation mode, the MLP 115 does not receive inputs from the routing 105 or the routing 110. Thus, in the third operation mode, the tile 100 operates as a dedicated BRAM, with BRAM 120 having full access to the routing fabric of the FPGA and the MLP 115 effectively disabled.

As shown in FIG. 1, the LRAM 125 is connected to the routing 105 and the routing 110. In some example embodiments, the routing connections for the LRAM 125 are maintained in all operation modes. To use data stored in the LRAM 125 for calculations by the MLP 115, control signals identify the address to read and the data at that address in the LRAM 125 is used. The data is provided from the LRAM 125 to the MLP 115 via intra-tile connections, without using the routing 105 or the routing 110.

The intra-tile connections shown between the LRAM 125 and the memory 140 to the floating-point MAC 130 and the integer MAC 135 operate at a higher bandwidth than the routing 105 and 110. In various example embodiments, the intra-tile data access speed is a factor of at least 10, 50, 100, or 500 times faster than the routing connection access speed.

The differences between the LRAM 125 and the BRAM 120 are typically implementation details such that the BRAM 120 is similar to a cache style memory (typically using SRAM cells) and the LRAM 125 is similar to a register file (typically using flops). However, these are not concrete rules, and other types of memory may be used for the LRAM 125 and the BRAM 120. In some example embodiments, the BRAM 120 has a greater storage capacity than the LRAM 125 and is optimized for area and the LRAM 125 is optimized for latency. In further example embodiments, the LRAM 125 stores a working set of sums of partial products for matrix multiplications.

Figure 2:
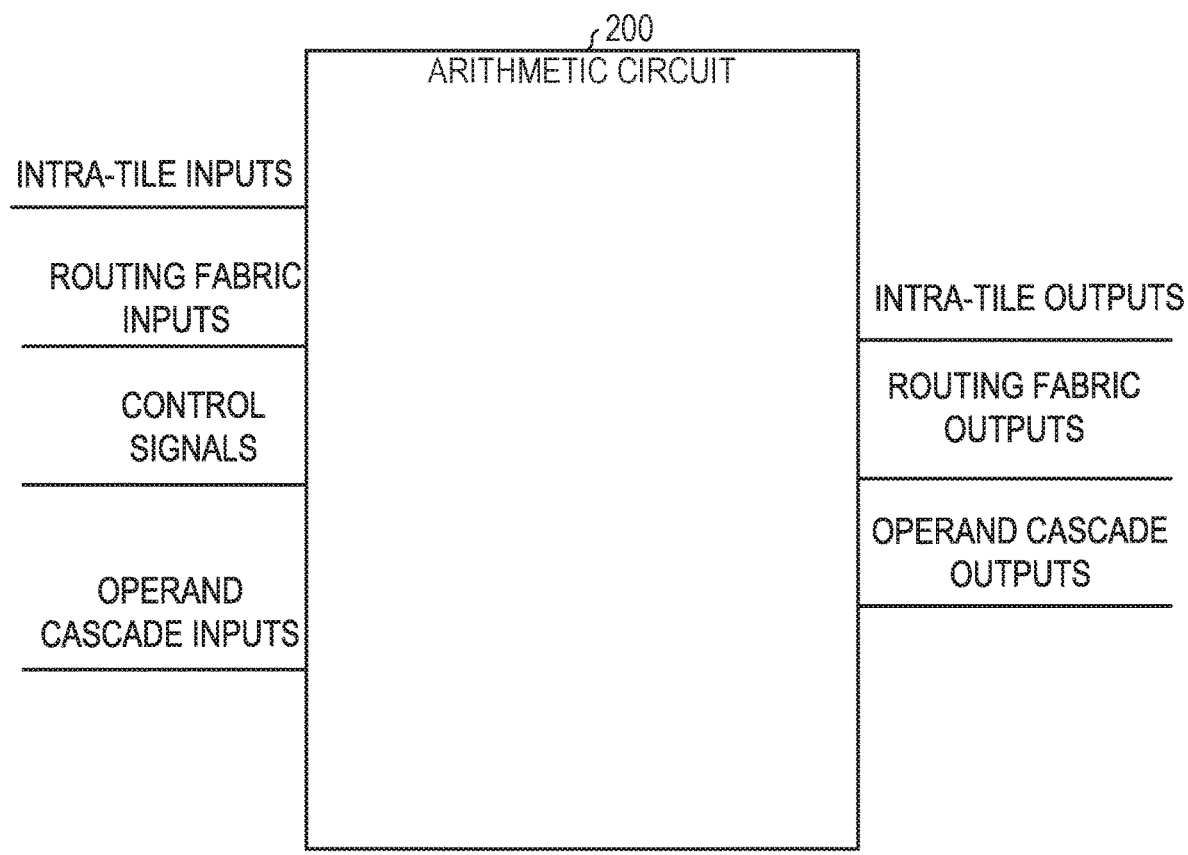
FIG. 2 is a high-level diagrammatic view of an arithmetic circuit portion of an FPGA tile that fuses memory and arithmetic circuits, according to some example embodiments.

FIG. 2 is a high-level diagrammatic view of an arithmetic circuit portion 200 of an FPGA tile that fuses memory and arithmetic circuits, according to some example embodiments. In some example embodiments, the arithmetic circuit 200 is the MLP 115. The arithmetic circuit 200 receives intra-tile inputs from the memory portion of the FPGA tile, routing fabric inputs from a routing fabric of the FPGA, control signals from the routing fabric of the FPGA, and operand cascade inputs from another FPGA tile without making use of the routing fabric. In various example embodiments, more or fewer inputs are present.

The arithmetic circuit 200 provides intra-tile outputs to the memory portion of the FPGA tile, routing fabric outputs to the routing fabric of the FPGA and operand cascade outputs to another FPGA tile without making use of the routing fabric. In various example embodiments, more or fewer outputs are present. Typically, the operand cascade inputs are received from a first FPGA tile, the arithmetic circuit 200 is part of a second FPGA tile, and the operand cascade outputs are provided to a third FPGA tile.

Figure 3:
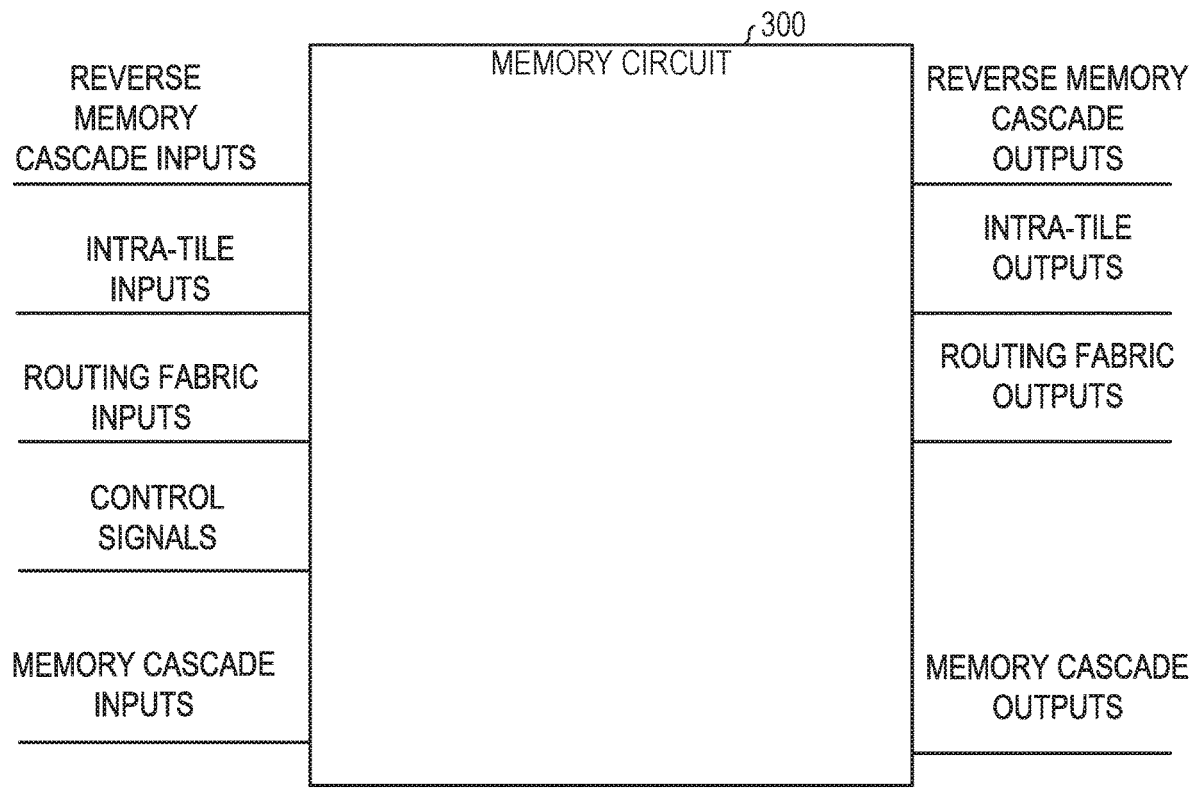
FIG. 3 is a high-level diagrammatic view of a memory circuit portion of an FPGA tile that fuses memory and arithmetic circuits, according to some example embodiments.

FIG. 3 is a high-level diagrammatic view of a memory circuit portion 300 of an FPGA tile that fuses memory and arithmetic circuits, according to some example embodiments. In some example embodiments, the memory circuit 300 is the BRAM 120. The memory circuit 300 receives intra-tile inputs from the arithmetic portion of the FPGA tile, routing fabric inputs from a routing fabric of the FPGA, control signals from the routing fabric of the FPGA, memory cascade inputs from a first FPGA tile, and reverse memory cascade inputs from a second FPGA tile. The cascade inputs do not make use of the routing fabric. The memory cascade inputs may comprise control signals as well as data signals. In various example embodiments, more or fewer inputs are present.

The memory circuit 300 provides intra-tile outputs to the arithmetic portion of the FPGA tile, routing fabric outputs to the routing fabric of the FPGA, memory cascade outputs to the second FPGA tile, and reverse memory cascade outputs to the first FPGA tile. In various example embodiments, more or fewer outputs are present.

Figure 4:
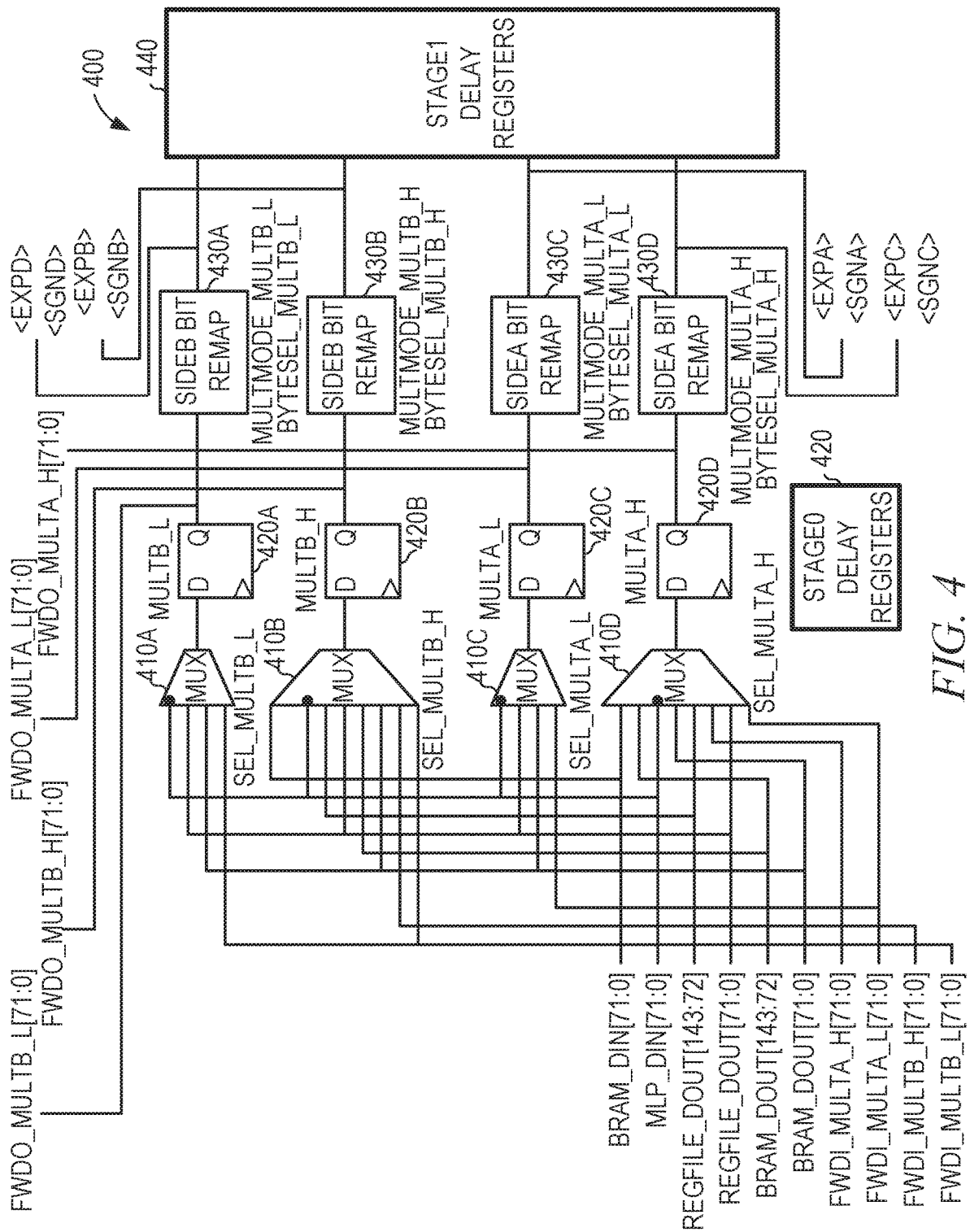
FIG. 4 is a diagrammatic view of a portion of an arithmetic circuit for fusing with memory in an FPGA tile, according to some example embodiments.

FIG. 4 is a diagrammatic view of a portion 400 of an arithmetic circuit for fusing with memory in an FPGA tile, according to some example embodiments. The portion 400 comprises multiplexers 410A. 410B, 410C, and 410D; registers 420A. 420B, 420C, and 420D, referred to collectively as stage 0 delay registers 420; bit remap logic 430A, 430B. 430C, and 430D; and stage 1 delay registers 440 (shown in more detail as individual registers 510A, 510B, 510C, 510D, 510E, 510F, 510G, 510H, 510I, 510J, 510K, 510L, 510M, 510N, 510O, and 510P in FIG. 5). The portion 400 accepts inputs for two multiply operands, A and B, remaps the operands to a format used by the next portion of the arithmetic circuit, and provides the remapped operands to delay registers used by the next portion.

The multiplexer 410A selects the low bits for the B operand from four options: MLP_DIN[71:0], 72 bits of data received via the routing fabric 105; REGFILE_DOUT[71:0]. 72 bits of data received from the LRAM 125 within the tile 100; BRAM_DOUT[71:0], 72 bits of data received from the BRAM 120 within the tile 100; and FWDI_MULTB_L [71:0], 72 bits of data received from the operand cascade input 145. The multiplexer 410B selects the high bits for the B operand from eight options: BRAM_DIN[71:0], 72 bits of data received via the routing fabric 110; REGFILE_DOUT [143:72], 72 bits of data received from the LRAM 125 within the tile 100; BRAM_DOUT[143:72], 72 bits of data received from the BRAM 120 within the tile 100; MLP_DIN

[71:0]; REGFILE_DOUT[71:0]; BRAM_DOUT[71:0]; and FWDI_MULTB_L[71:0]. Thus, the B operand is generated from a combination of inputs from one or more of the routing fabric 105, the routing fabric 110, the LRAM 125, the BRAM 120, and the operand cascade input 145.

The low bits for the A operand are selected by the multiplexer 410C from four options: MLP_DIN[71:0]; REGFILE_DOUT[71:0]; BRAM_DOUT[71:0]; and FWDI_MULTA_L[71:0], 72 bits of data received from the operand cascade input 145. The high bits for the A operand are selected by the multiplexer 410D from eight options: BRAM_DIN[71:0]; MLP_DIN[71:0]; REGFILE_DOUT [143:72]; REGFILE_DOUT[71:0]; FWDI_MULTA_L[71: 0]; BRAM_DOUT[143:72]; BRAM_DOUT[71:0]; and FWDI_MULTA_H[71:0]. 72 bits of data received from the operand cascade input 145. Thus, the A operand is also generated from a combination of inputs from one or more of the routing fabric 105, the routing fabric 110, the LRAM 125, the BRAM 120, and the operand cascade input 145.

The inputs selected by the multiplexers 410A-410D are optionally stored in the corresponding one of the registers 420A-420D, which provide data to the operand cascade output 160 in the form of FWDO_MULTB_L[71:0], the low bits of the B operand; FWDO_MULTIB_H[71:0], the high bits of the B operand; FWDO_MULTA_L[71:0], the low bits of the A operand; and FWDO_MULTA_H[71:0], the high bits of the A operand. Additionally, each of the registers 420A-420D is accessed by the corresponding one of the bit remap logics 430A-430D. Each of the bit remap logics 430A-430D remaps the inputs based on a multiplication mode and byte selection mode input. Exponent and sign bits are output from the bit remap logics 430A-430D as signals <EXPA>, <SGNA>, <EXPB>, <SGNB>, <EXPC>, <SGNC>, <EXPD>, and <SGND>. The remapped inputs are provided to the stage 1 delay registers 440, for access by the next portion of the arithmetic circuit.

The inputs selected by the multiplexers 410A-410D are controlled by configuration signals SEL_MULTB_L, SEL_MULTB_H, SEL_MULTA_L, and SEL_MULTA_H. Thus, the arithmetic circuit is configured by one or more configuration signals to receive inputs from a first connection fabric, a second connection fabric, a first fused memory, a second fused memory, an operand cascade input, or any suitable combination thereof. As an example, in response to a first configuration signal, the arithmetic circuit is configured to perform operations on data received via a routing fabric (e.g., MLP_DIN[71:0], a possible selection by each of the multiplexers 410A-410D) and data received within a tile of an FPGA from a first memory (e.g., BRAM_DOUT[143: 72], a possible selection by the multiplexers 410B and 410D or BRAM_DOUT[71:0], a possible selection by the multiplexers 410A and 410C). As another example, in response to a second configuration signal, the arithmetic circuit is configured to perform operations on data received via the routing fabric and data received within a tile of the FPGA from a second memory (e.g., REGFILE_DOUT[143:72], a possible selection by the multiplexers 410B and 410D or REGFILE_DOUT[71:0], a possible selection by the multiplexers 410A and 410C).

Figure 5:
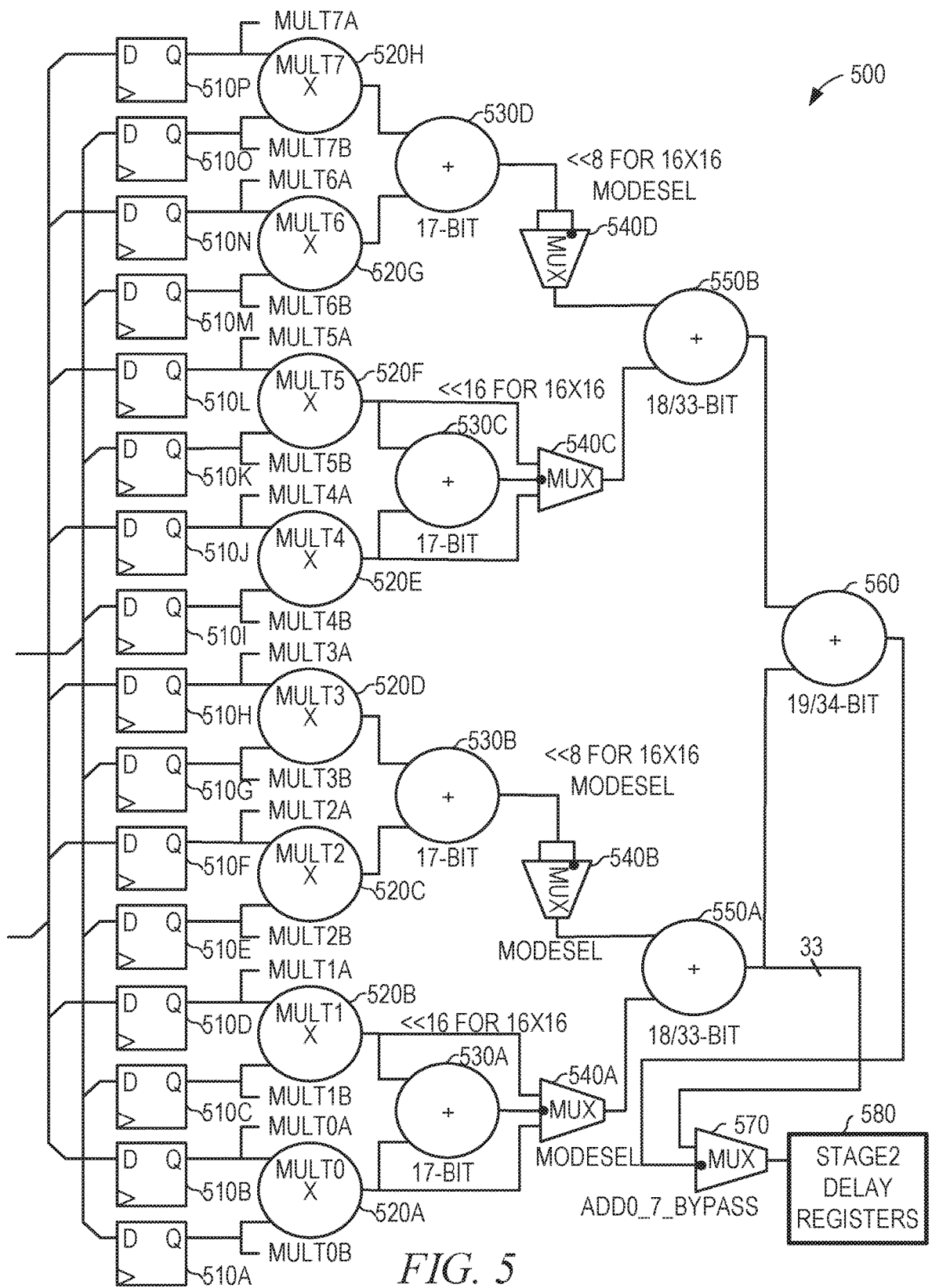
FIG. 5 is a diagrammatic view of a portion of an arithmetic circuit for fusing with memory in an FPGA tile, according to some example embodiments.

FIG. 5 is a diagrammatic view of a portion 500 of an arithmetic circuit for fusing with memory in an FPGA tile, according to some example embodiments. The portion 500 comprises registers 510A, 510B, 510C, 510D, 510E, 510F, 510G, 510H, 510I, 510J, 510K, 510L, 510M, 510N, 510O, and 510P; multipliers 520A, 520B, 520C, 520D, 520E, 520F, 520G, and 520H; adders 530A, 530B, 530C, 530D, 550A, 550B, and 560; multiplexers 540A, 540B, 540C, 540D, and 570; and stage 2 delay registers 580.

Each of the registers 510A-510P stores eight bits of data for an operand for one of the multipliers 520A-520H. Each of the multipliers 520A-520H accepts eight bits of the A operand and eight bits of the B operand. Thus, the portion 500, in total, handles 64 bits of the A operand and 64 bits of the B operand. To handle the complete input received by the portion 400, the portion 500 is duplicated, with each instance of the portion 500 handling half of the inputs.

In a first operation mode, the portion 500 is configured to determine a sum of eight 8-bit multiply operations. By sign-extending or padding with leading zeros, as appropriate, the sum of fewer multiply operations or the sum of eight smaller (e.g., 6-bit or 4-bit) operations may be determined in the first operation mode. In a second operation mode, the portion 500 is configured to determine a sum of two 16-bit multiply operations. By sign-extending or padding with leading zeros, as appropriate, a single multiply operation or the sum of two smaller (e.g., 12-bit or 10-bit) operations may be determined in the second operation mode. In a third operation mode, the portion 500 in combination with the second instance of the portion 500 is configured, using an additional shifter and a wider adder, to determine a single 32-bit multiply operation. By sign-extending or padding with leading zeros, as appropriate, a smaller multiply operation (e.g., 18-bit or 24-bit) may be determined in the third operation mode. In additional operation modes, one or more individual multiply results may be provided at the output, in addition to or instead of the sum of the multiply operations.

With respect to the first operation mode, each of the eight multipliers 520A-520H performs an eight-bit multiplication using a different portion of the operands A and B as inputs. The results of the eight multiplications are pairwise summed by the adders 530A-530D. The four addition results are pairwise summed by the adders 550A-550B, using the multiplexers 540A-540D (controlled by a MODESEL signal) to determine whether to take the addition result directly or shifted as shown. The shifted results are used to support 16-bit multiplication. The two results of the adders 550A-550B are summed by the adder 560. The result of the adder 560 is the sum of the eight eight-bit multiplications, and is provided, via the mux 570, to the stage 2 delay registers 580.

With respect to the second operation mode, the multipliers 520A-520D together, in combination with the adders 530A, 530B, and 550A, determine a first 16-bit multiplication result. The multipliers 520E-520H, in combination with the adders 530C, 530D, and 550B, determine a second 16-bit multiplication result. Four multipliers of a first operand size can be used to generate multiplication results of a second operand size that is twice the first operand size. The larger operands are divided into two portions, high and low, and organized as follows, wherein AH represents the high portion of the A operand, AL represents the low portion of the A operand, BH represents the high portion of the B operand, and BL represents the low portion of the B operand. AH ALxBH BL=ALxBL+AHxBL<<SIZE+BHxAL<<SIZE+ AHxBH<<2xSIZE.

Thus, in the second operation mode, the multiplier 520D multiplies BL with AH and the multiplier 520C multiplies BH with AL. The results are added by the adder 530B and the result from the adder 530B is shifted left eight bits. The multiplier 520B multiplies BH with AH and the result is shifted left sixteen bits. The multiplier 520A multiples BL with AL. Following the results through the adders 530A and 550A, the output of the adder 550A is the result of the 16-bit multiply operation. The multipliers 520E-520H and adders 530C, 530D, and 550B are similarly configured to process a second 16-bit multiply operation. The results of the two operations are summed by the adder 560 and provided to the stage 2 delay registers 580 via the multiplexer 570. The size of the output of the adder 560 is one bit larger than size of the outputs of the adders 550A and 550B. Thus, in an eight-bit mode of operation, the adder 560 provides a 19-bit output and in a sixteen-bit mode of operation, the adder 560 provides a 34-bit output.

In some example embodiments, the portion 500 performs only a single 16-bit multiply in the second operation mode. In these embodiments, the results generated by the multipliers 520E-520H and the adders 530C, 530D, 550B, and 560 are ignored. Instead, the multiplexer 570 is configured to provide the output from the adder 550A, containing the single 16-bit multiply result, to the stage 2 delay registers 580.

In the third operation mode, the four 16-bit multiply operations provided by two instances of the portion 500 are combined in a manner analogous to that described with respect to the second operation mode, using an additional shifter and a wider adder, resulting in a circuit that determines a single 32-bit multiplication, making use of the adder 630 discussed below with respect to FIG. 6.

Though the portion 500 is described as performing multiplication operations on the selected inputs and then summing the result of the multiplication operations, other configurations of the arithmetic circuit are contemplated. For example, the inputs from the registers 510A-510P may be provided to the multipliers 520A-520H as shown and also be provided to a set of adders. Using a multiplexer for each multiplier/adder pair, the input to the adders 530A-530D is selected either as the multiplication result or the addition result. Thus, based on a configuration signal controlling the multiplexers, the arithmetic circuit either determines a sum of the input operands or the sum of products of the input operands (as shown in FIG. 5).

Figure 6:
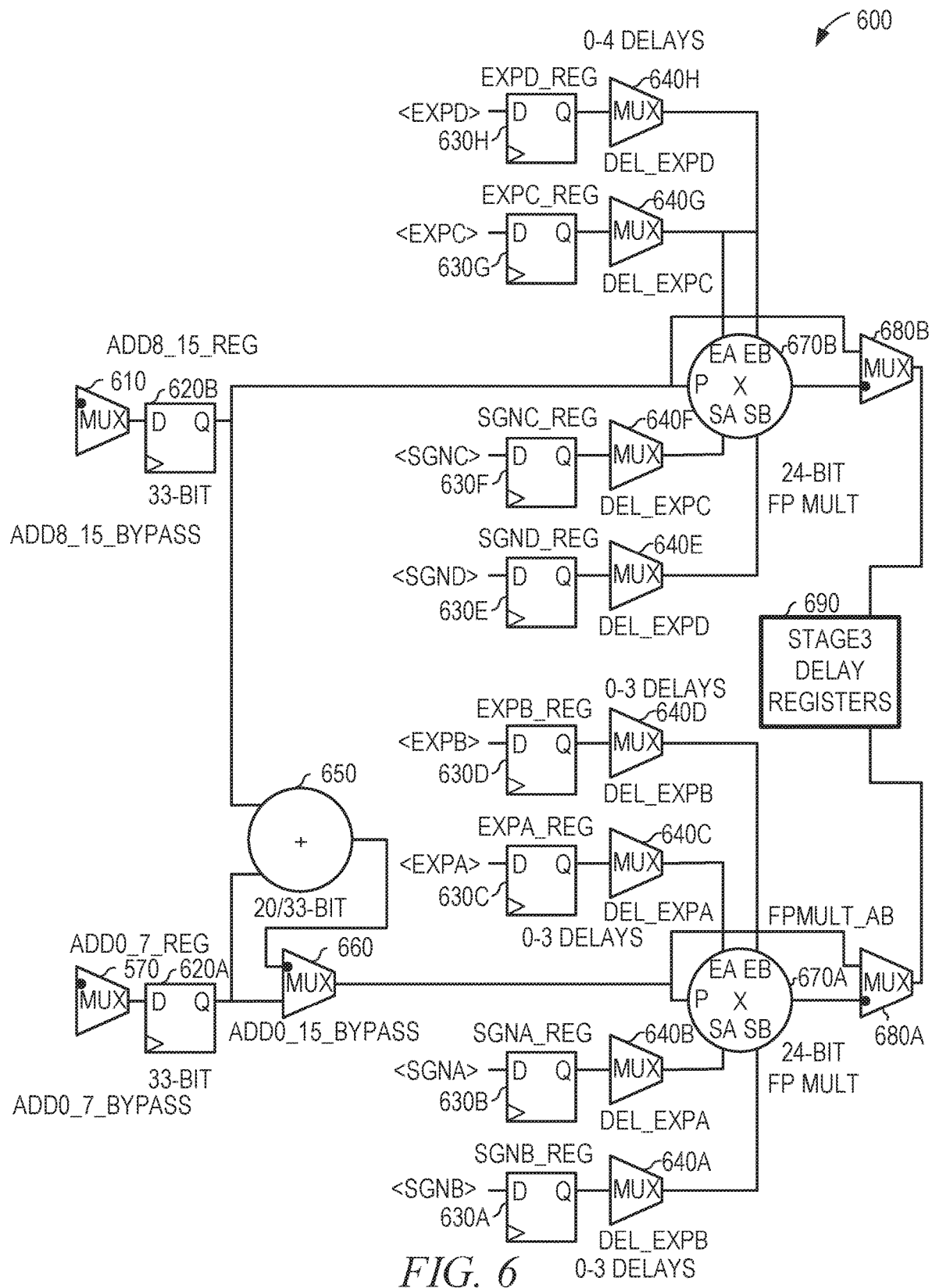
FIG. 6 is a diagrammatic view of a portion of an arithmetic circuit for fusing with memory in an FPGA tile, according to some example embodiments.

FIG. 6 is a diagrammatic view of a portion 600 of an arithmetic circuit for fusing with memory in an FPGA tile, according to some example embodiments. The portion 600 comprises the multiplexer 570 of FIG. 5 and the corresponding multiplexer 610 from a duplicate of the portion 500 that handles the high half of the inputs A and B. The outputs of the multiplexers 570 and 610 are provided to the stage 2 delay registers 620A and 620B, each 34 bits wide. Inputs to the portion 600 are also received from the stage 1 delay registers 630A, 630B, 630C, 630D, 630E, 630F, 630G, and 630H, storing the <SGNA>, <SGNB>, <SGNC>, <SGND>, <EXPA>, <EXPB>, <EXPC>, and <EXPD> values generated by the bit remap logics 430A-430D of FIG. 4. The portion 600 further includes an adder 650; multiplexers 640A, 640B, 640C, 640D, 640E, 640F, 640G, 640H, 660, 680A, and 680B; multipliers 670A and 670B; and stage 3 delay registers 690.

The results from the portion 500 and its duplicate are added by the adder 650. The multiplexer 660 selects either the results from the portion 500 or the summed results from both portions, based on a value of an ADD0_15_BYPASS signal, and provides the selected result to the multiplier 670A and the multiplexer 680A. Based on the <EXPA>, <EXPB>, <SGNA>, and <SGNB> values received via the multiplexers 640A-640D and the value received from the multiplexer 660, the multiplier 670A generates a 24-bit floating point multiplication result. Similarly, based on the <EXPC>, <EXPD>, <SGNC>, and <SGND> values received via the multiplexers 640E-640H and the result received from the register 620B, the multiplier 670B generates a second 24-bit floating point multiplication result. Based on an FPMULT_AB signal, the multiplexers 680A-680B output either the 24-bit floating point results generated by the multipliers 670A-670B or pass through the results provided by the register 620B and the multiplexer 660. The outputs of the multiplexers 680A-680B are provided to the stage 3 delay registers 690.

Thus, in one operation mode, the outputs of the multiplexers 680A-680B of the portion 600 are the outputs of the portion 500 and its duplicate portion, bypassing the adder 650 and the multipliers 670A-670B. In a second operation mode, the output of the multiplexer 680A is the sum of all multiplies performed by the portion 500 and its duplicate, and the output of the multiplexer 680B is the sum of the multiplies performed by the duplicate of the portion 500. In a third operation mode, the output of the multiplexers 680A-680B are 24-bit floating point versions of the outputs of the portion 500 and its duplicate portion. In a fourth operation mode, the output of the multiplexer 680A is a 24-bit floating point representation of the sum of all multiplies performed by the portion 500 and its duplicate, and the output of the multiplexer 680B is a 24-bit floating point representation of the sum of the multiplies performed by the duplicate of the portion 500.

Figure 7:
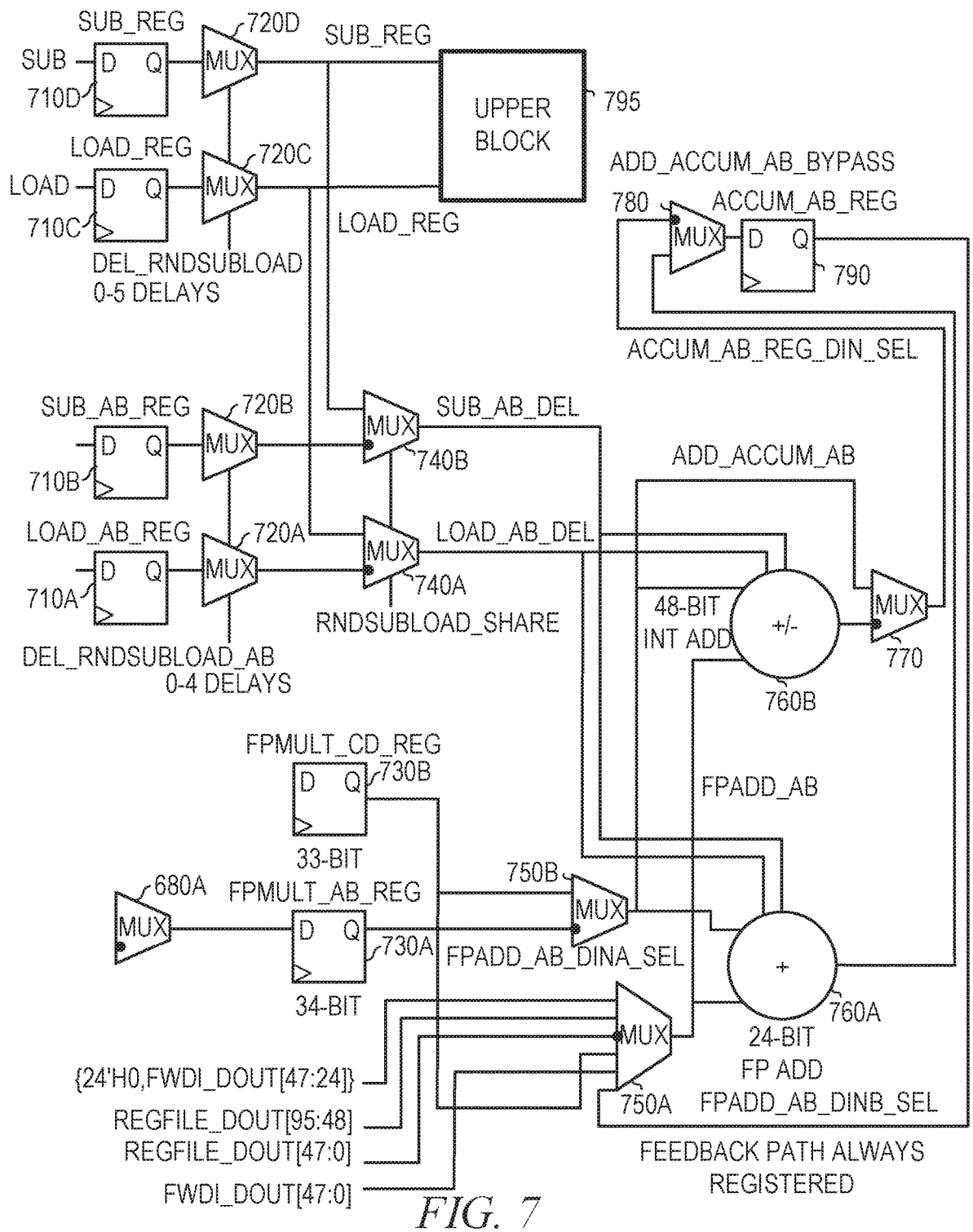
FIG. 7 is a diagrammatic view of a portion of an arithmetic circuit for fusing with memory in an FPGA tile, according to some example embodiments.

FIG. 7 is a diagrammatic view of a portion 700 of an arithmetic circuit for fusing with memory in an FPGA tile, according to some example embodiments. The portion 700 includes the multiplexer 680A of FIG. 6; stage 1 delay registers 710A, 710B, 710C, and 710D; multiplexers 720A, 720B, 720C, 720D, 740A, 740B, 750A, 750B, 770, and 780; stage 3 delay registers 730A and 730B; adders 760A and 760B; stage 4 delay register 790. Connections between the portion 700 and upper block 795 are also shown in FIG. 7. The upper block 795 refers to the portion of the arithmetic circuit shown in FIG. 8.

The output of the multiplexer 680A is stored in the stage 3 delay register 730A. The stage 3 delay register 730B stores either the output of the multiplexer 660B of FIG. 6 or an addition result generated by adding the output of the multiplexer 660B to FWDI_DOUT[47:0], as described below with respect to FIG. 8.

The multiplexer 750A selects a value from FWDI_DOUT [47:0], REGFILE_DOUT[47:0], 48 bits from the LRAM 125; REGFILE_DOUT[95:48], a different 48 bits from the LRAM 125; delay register 730B; and {24'H0, FWDI_DOUT[47:24]}, 24 0 bits prepended to 24 bits of the operand cascade input. The multiplexer 750B selects a value from the stage 3 delay registers 730A and 730B. The outputs of the multiplexers 750A and 750B are provided to the adder 760A and the adder 760B. Based on the SUB_AB_DEL and LOAD_AB_DEL signals received from the multiplexers 740A and 740B and the selected values received from the multiplexers 750A and 750B, the adder 760A generates an addition result. Based on the SUB_AB_DEL and LOAD_AB_DEL signals received from the multiplexers 740A and 740B and the selected values received from the multiplexers 750A and 750B, the adder 760B generates an addition result or a subtraction result. The SUB signals control whether the adders 760A and 760B generate addition or subtraction results. The LOAD signals control whether the adders 760A and 760B add the input value to the accumulated value or ignore the accumulated value and merely load the input value, providing the input value as the output and setting the accumulator value to the input value. The DEL signals have a delay of 0-4 cycles.

The bypass multiplexer 770 selects either the result generated by the adder 760B or the result of the multiplexer 750B. Thus, bypass multiplexer 770 provides either an addition result from the portion 700 or either result from FIG. 6. The multiplexer 780 selects either the output of the multiplexer 770 or the output of the adder 760A and provides the result to the stage 4 delay register 790.

Figure 8:
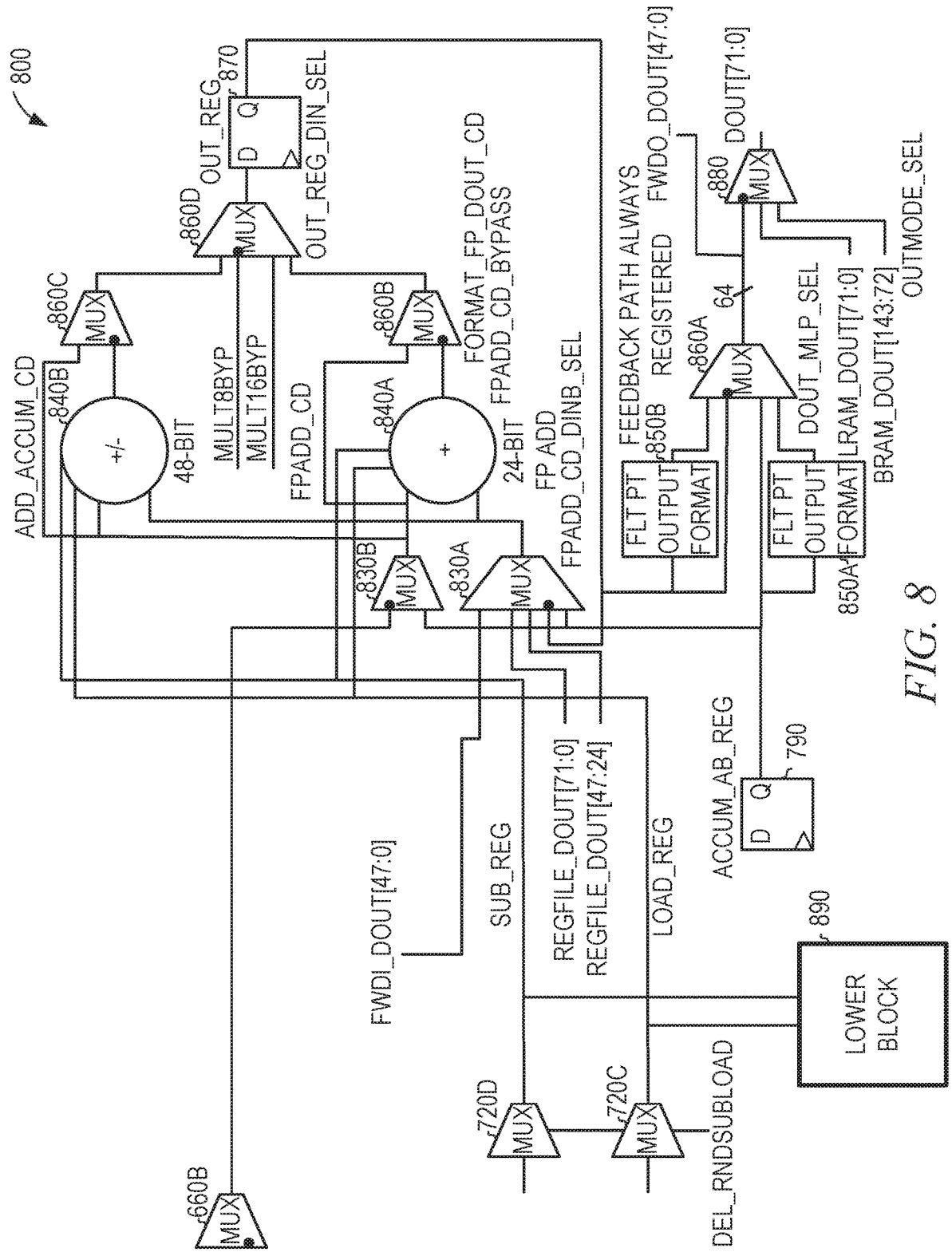
FIG. 8 is a diagrammatic view of a portion of an arithmetic circuit for fusing with memory in an FPGA tile, according to some example embodiments.

FIG. 8 is a diagrammatic view of a portion 800 of an arithmetic circuit for fusing with memory in an FPGA tile, according to some example embodiments. The portion 800 corresponds to the upper block 795 shown in FIG. 7. The portion 800 includes the multiplexer 660B of FIG. 6; the multiplexers 720C and 720D of FIG. 7; adders 840A and 840B; the stage 4 delay register 790; multiplexers 830A, 830B, 860A, 860B, 860C, 860D, and 880; logic blocks 850A and 850B; and output register 870. The portion 700 of FIG. 7 is represented in FIG. 8 as lower block 890.

The multiplexer 830A selects a value from FWDI_DOUT [47:0]; REGFILE_DOUT[71:0]; REGFILE_DOUT[47:24], 24 bits from the LRAM 125; and value from the output register 870, received via a feedback path. The multiplexer 830B selects either the value from the multiplexer 660B or the value from the stage 4 delay register 790.

The adder 840A sums the outputs from the multiplexers 830A and 830B, as modified by the SUB_REG and LOAD_REG signals. The SUB signals control whether the adder 840A generates addition or subtraction results. The LOAD signals control whether the adder 840A adds the input value to the accumulated value or ignores the accumulated value and merely loads the input value, providing the input value as the output and setting the accumulator value to the input value. As SUB_REG and LOAD_REG are not DEL signals, there is no delay in handling the inputs. The adder 840B adds the outputs from the multiplexers 830A-830B or takes the difference, depending on the SUB_REG signal. The multiplexers 860B and 860C select either the outputs of the adders 840A-840B or, based on an FPADD_CD_BYPASS signal, provide the output from the multiplexer 830B. The multiplexer 860D selects an output from the multiplexer 860B, the multiplexer 860C, a MULT8BYP input, and a MULT16BYP input. If a bypass signal is used, the MULT8BYP signal is selected when the circuit is configured to perform 8-bit operations, and the MULT16BYP signal is selected when the circuit is configured to perform 16-bit operations.

The output of the multiplexer 860D is stored in the output register 870. If the circuit is configured to perform a floating point format conversion (e.g., from an internal 24-bit floating point format to a 16-bit output floating-point format), the value in the output register 870 is processed by the logic block 850B before being provided as an input to the multiplexer 860A. Likewise, if the circuit is configured to perform the floating-point format conversion, the value in the stage 4 delay register 790 is processed by the logic block 850A. The multiplexer 860A selects an input from the processed and unprocessed values of the registers 790 and 870. The output of the multiplexer 860A is provided as FWDO_DOUT[47:0], a 48-bit operand cascade output.

The multiplexer 880 selects, based on an OUTPUT_SEL signal, the output value for the circuit from the output of the multiplexer 860A; LRAM_DOUT[71:0], a 72-bit value read from the LRAM 125; and BRAM_DOUT[143:72]. The selected output value is provided as DOUT[71:0], a 72-bit output provided to the routing fabric 105.

Figure 9:
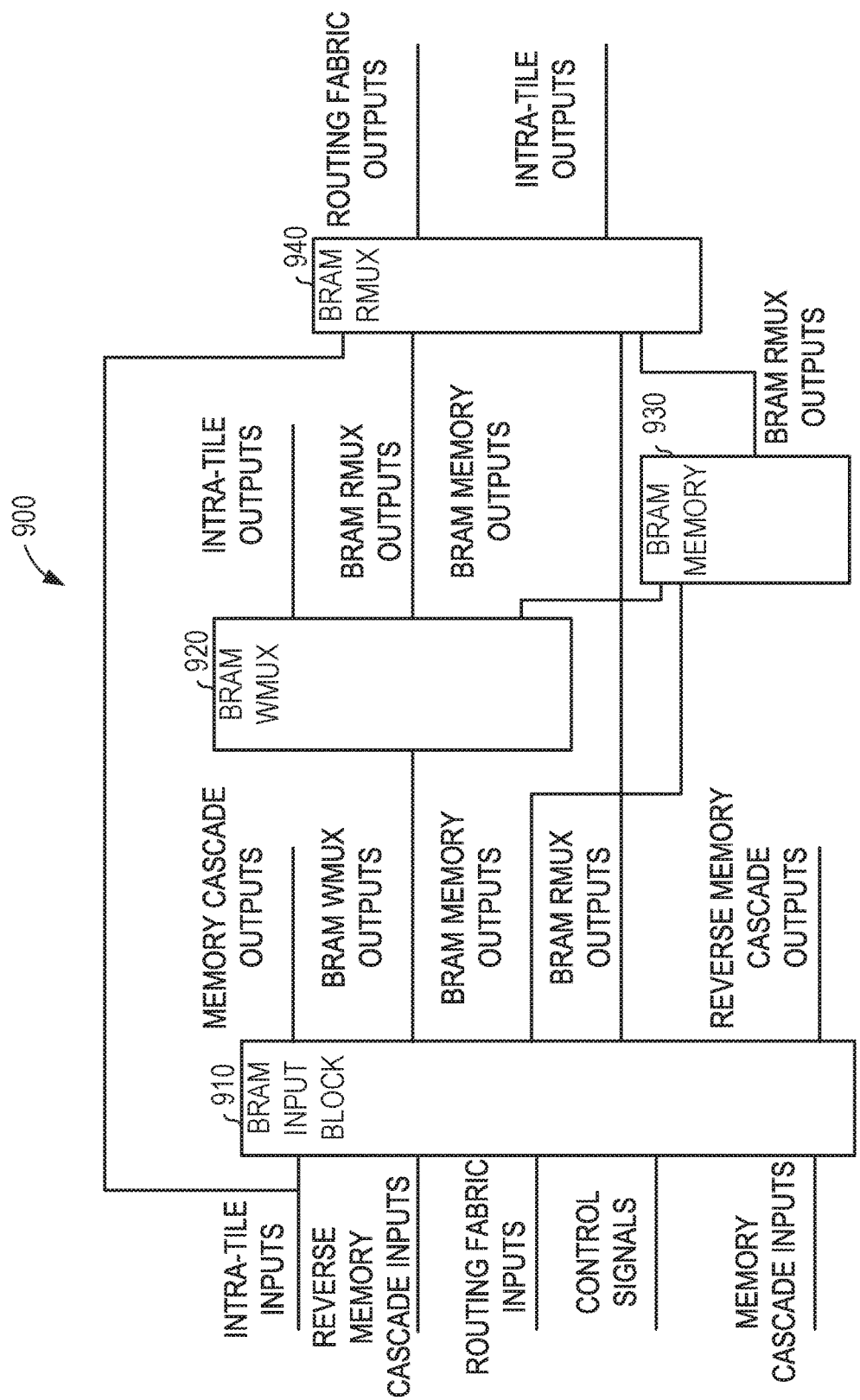
FIG. 9 is a diagrammatic view of a memory circuit for fusing with an arithmetic circuit in an FPGA tile, according to some example embodiments.

FIG. 9 is a diagrammatic view of a memory circuit 900 for fusing with an arithmetic circuit in an FPGA tile, according to some example embodiments. The memory circuit 900 comprises a BRAM input block 910, a BRAM write multiplexer (WMUX) 920, a BRAM memory 930, and a BRAM read multiplexer (RMUX) 940. FIG. 9 provides additional details to the high-level diagrammatic view of FIG. 3.

The BRAM input block 910 receives intra-tile inputs from an arithmetic circuit, routing fabric inputs and control signals from a routing fabric, memory cascade inputs from a first FPGA tile, and reverse memory cascade inputs from a second FPGA tile. Based on the inputs and the control signals, the BRAM input block 910 provides inputs to the BRAM WMUX 920, the BRAM memory 930, and the BRAM RMUX 940. Also based on the inputs and the control signals, the BRAM input block 910 provides memory cascade outputs to a first FPGA tile without using the routing fabric and reverse memory cascade outputs to a second FPGA tile without using the routing fabric.

The signals provided by the BRAM input block 910 to the BRAM WMUX 920 comprise a write address, a write enable signal, data, a read address, and a read enable signal. Based on a WRMEM_INPUT_SEL signal, a set of multiplexers in the BRAM input block 910 selects the signals to be provided to the BRAM WMUX 920 from the inputs to the BRAM input block 910. As an example, the write address is selected either from the control signals provided to the BRAM input block 910 from the routing fabric or from the cascade memory inputs. As another example, the data is selected from data provided by the intra-tile inputs or from data provided by the cascade memory inputs. As yet another example, the write enable signal is selected from the control signals provided to the BRAM input block 910 from the routing fabric or from the cascade memory inputs.

The signals provided by the BRAM input block 910 to the BRAM memory 930 comprise the write address and the read enable signal, as provided to the BRAM WMUX 920. The BRAM input block 910 provides the read address to the BRAM RMUX 940.

The BRAM WMUX 920 provides data to the BRAM memory 930. Based on the read enable signal received from the BRAM input block 910, the BRAM memory 930 determines whether to store the data or not. If the data is stored, the BRAM memory 930 uses the write address provided by the BRAM input block 910 to determine the location to store the data.

The BRAM memory 930 provides data to the BRAM RMUX 940. The provided data is either the data provided by the BRAM WMUX 920 or data read from the write address, depending on the value of the read enable signal. The BRAM RMUX 940 selects from the intra-tile input data and the data provided by the BRAM memory 930 to generate outputs to the routing fabric and intra-tile outputs.

In some example embodiments, a configuration signal is provided to the memory circuit 900 that controls access by the memory circuit 900 to the routing fabric of the FPGA. In the mode described above, the memory circuit 900 has access to a portion of the routing connections of a fused memory and arithmetic tile (e.g., the routing 110 of FIG. 1), but not all of the routing connections. In a second mode, the memory circuit 900 has access to all of the routing connections of the fused memory and arithmetic tile (e.g., the routing 105 and the routing 110 of FIG. 1). In the second mode, the fused memory and arithmetic tile may be used as a standard memory-only tile. Additionally, the fused memory and arithmetic tile may be first used as a memory-only tile to rapidly load the memory and then switched to the first mode to operate with the arithmetic circuit having access to half of the routing connections and the memory circuit having half of the routing connections.

Using the intra-tile communications, the arithmetic circuit portion of the FPGA tile can read and write data to/from the BRAM memory 930 while operating at intra-tile communication speeds instead of slower routing fabric speeds. As a result, more data is processed by the arithmetic circuit portion than is possible without the use of intra-tile communications. This decoupling of the processing from the provision of parameters is particularly useful when many calculations are to be performed on the same numbers and the intermediate results are not important. For example, in matrix multiplication, each number in a row of the first operand is multiplied by each number in a column of the second operand and the sum of the results is stored as an element in the result matrix. This process is repeated for each row of the first operand and each column of the second operand, but the individual multiplication results are discarded. Accordingly, by loading the matrices into the BRAM memory 930 using the routing fabric of the FPGA and then performing the calculations using the arithmetic portion while loading the individual multiplication operands from the BRAM memory 930 using the intra-tile communications, the throughput of the fused arithmetic and memory tile is substantially increased over prior art solutions that used separate arithmetic and memory tiles.

Figure 10:
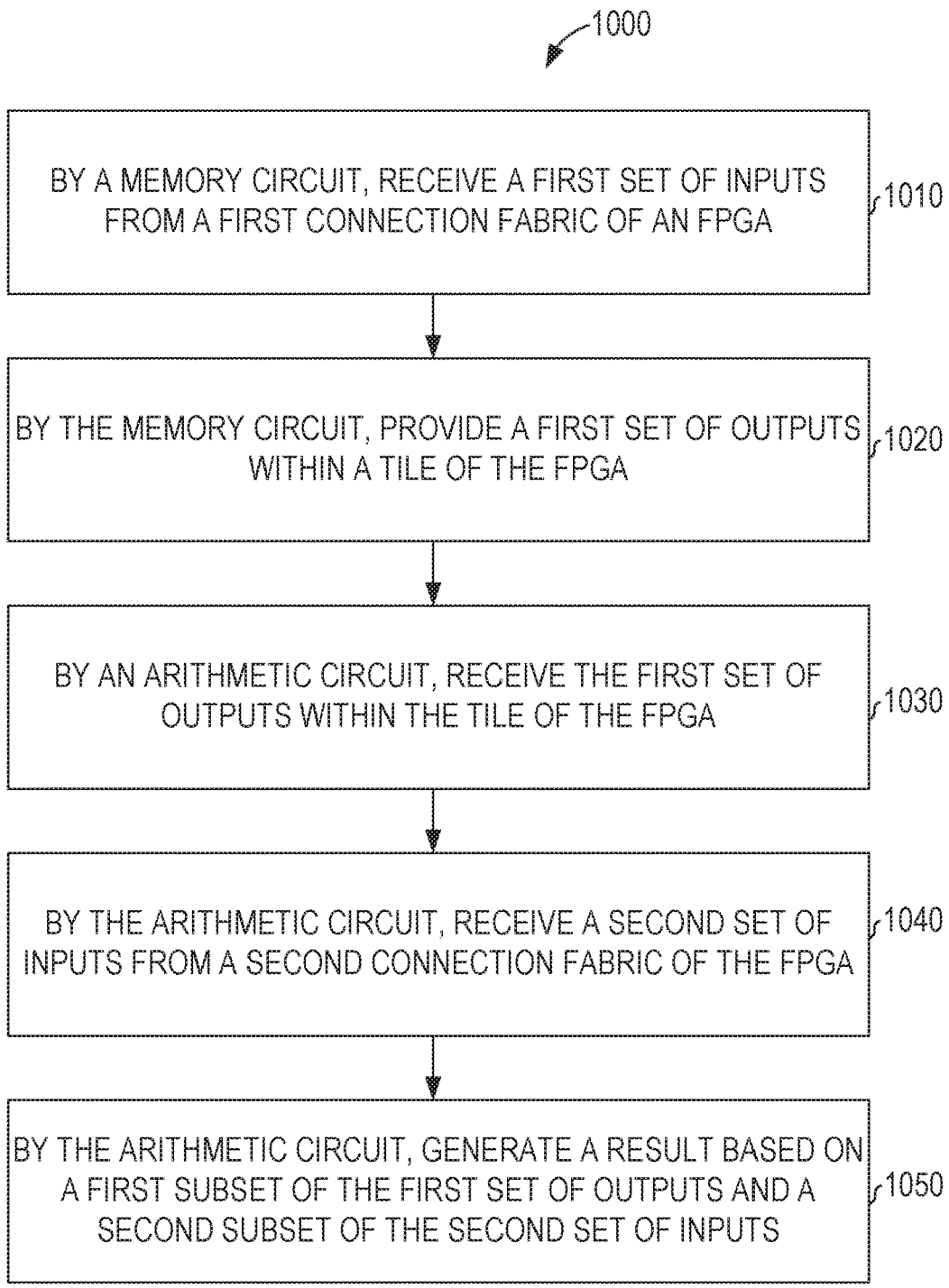
FIG. 10 is a flowchart illustrating operations of a method performed by a fused memory and arithmetic circuit, according to various embodiments of the invention.

FIG. 10 is a flowchart illustrating operations of a method 1000 performed by a fused memory and arithmetic circuit, according to various embodiments of the invention. By way of example and not limitation, the method 1000 is described as being performed by the circuits of FIGS. 1-9.

In operation 1010, a memory circuit receives a first set of inputs from a first connection fabric of an FPGA. As an example, the BRAM 120 receives the first set of inputs from the routing fabric 110 of an FPGA. In this example, the first set of inputs comprises a read enable signal and an address.

The memory circuit, in operation 1020, provides a first set of outputs within a tile of the FPGA. In this example, the BRAM RMUX 940 of the BRAM 120 provides data read from the BRAM memory 930 from the address received in operation 1010 to the intra-tile outputs of FIG. 9.

An arithmetic circuit receives the first set of outputs within the tile of the FPGA in operation 1030. In this example, the MLP 115 receives the data as the BRAM_D-OUT signals shown in FIG. 4.

In operation 1040, the arithmetic circuit receives a second set of inputs from a second connection fabric of the FPGA. In this example, the MLP 115 receives the second set of inputs from the routing fabric 105 of the FPGA. This is also shown as the MLP_DIN input signals of FIG. 4.

The arithmetic circuit, in operation 1050, generates a result based on a first subset of the first set of outputs and a second subset of the second set of inputs. As used herein, a subset may comprise the entirety of a set. Thus, if 64 bits of data are provided by the memory and 64 bits of data are provided by the routing fabric, the arithmetic result may be based on any portion of the inputs, so long as it depends on both inputs. As an example, each of the 64 bits of input may be treated as eight 8-bit operands and the generated result may be the sum of eight multiplication operations performed on pairs of 8-bit operands, one operand in each pair received via the intra-tile communication from the memory and one operand in each pair received via the routing fabric of the FPGA.

Figure 11:
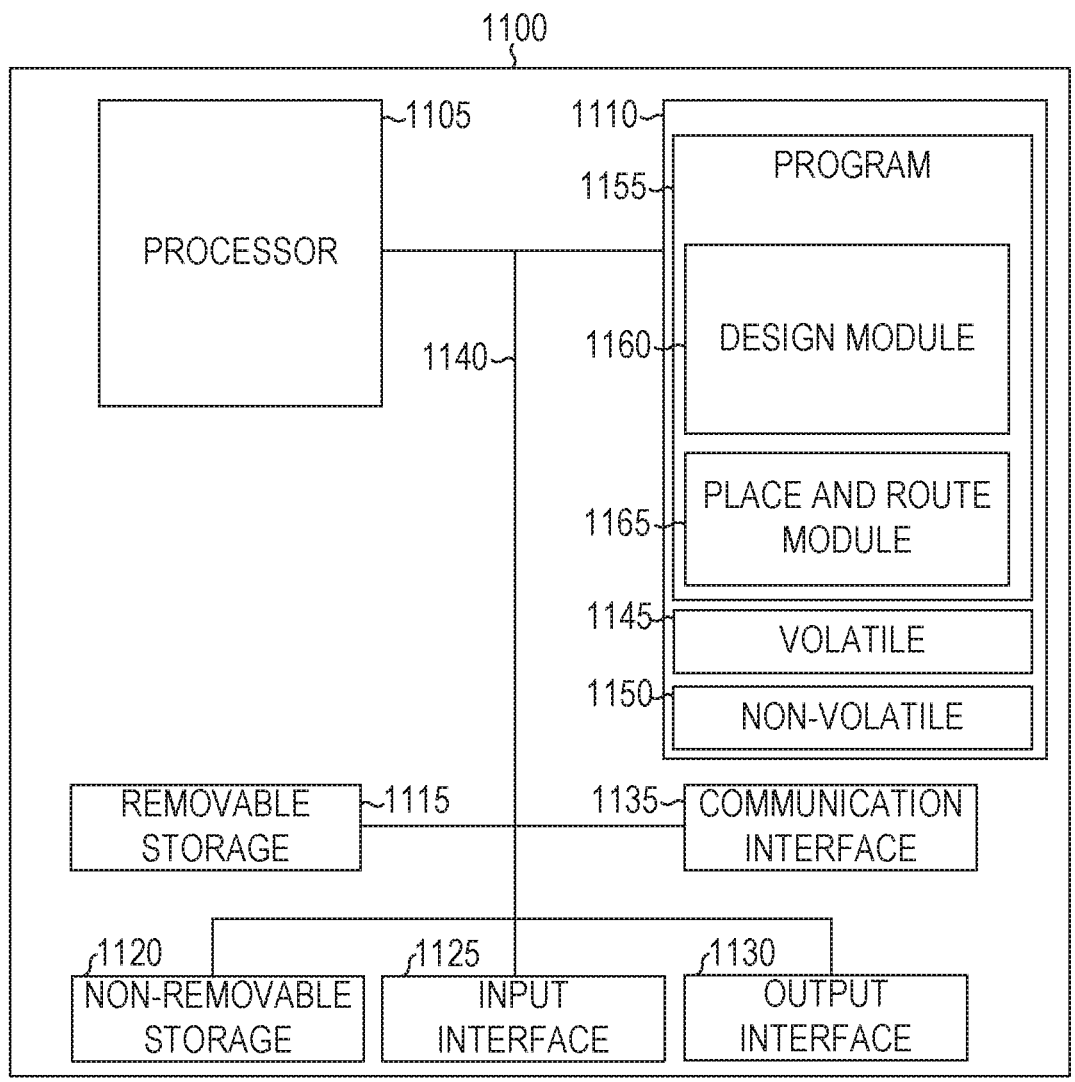
FIG. 11 is a block diagram illustrating components of a system for controlling fabrication of circuits described herein, according to some example embodiments.

FIG. 11 is a block diagram illustrating components of a computer 1100 that programs an FPGA, according to some example embodiments. All components need not be used in various embodiments. For example, clients, servers, autonomous systems, and cloud-based network resources may each use a different set of components, or, in the case of servers, for example, larger storage devices.

One example computing device in the form of a computer 1100 (also referred to as computing device 1100 and computer system 1100) may include a processor 1105, memory storage 1110, removable storage 1115, and non-removable storage 1120, all connected by a bus 1140. Although the example computing device is illustrated and described as the computer 1100, the computing device may be in different forms in different embodiments. For example, the computing device may instead be a smartphone, a tablet, a smartwatch, or another computing device including elements the same as or similar to those illustrated and described with regard to FIG. 11. Devices such as smartphones, tablets, and smartwatches are collectively referred to as "mobile devices." Further, although the various data storage elements are illustrated as part of the computer 1100, the storage may also or alternatively include cloud-based storage accessible via a network, such as the Internet. or server-based storage.

The memory storage 1110 may include volatile memory 1145 and non-volatile memory 1150 and may store a program 1155. The computer 1100 may include, or have access to, a computing environment that includes a variety of computer-readable media, such as the volatile memory 1145; the non-volatile memory 1150: the removable storage 1115: and the non-removable storage 1120. Computer storage includes random-access memory (RAM), read-only memory (ROM), erasable programmable read-only memory (EPROM) and electrically erasable programmable read-only memory (EEPROM), flash memory or other memory technologies, compact disc read-only memory (CD ROM), digital versatile disks (DVD) or other optical disk storage, magnetic cassettes, magnetic tape, magnetic disk storage or other magnetic storage devices, or any other medium capable of storing computer-readable instructions.

The computer 1100 may include or have access to a computing environment that includes an input interface 1125, an output interface 1130, and a communication interface 1135. The output interface 1130 may interface to or include a display device, such as a touchscreen, that also may serve as an input device. The input interface 1125 may interface to or include one or more of a touchscreen, a touchpad, a mouse, a keyboard, a camera, one or more device-specific buttons, one or more sensors integrated within or coupled via wired or wireless data connections to the computer 1100, and other input devices. The computer 1100 may operate in a networked environment using the communication interface 1135 to connect to one or more remote computers, such as database servers. The remote computer may include a personal computer (PC), server, router, network PC, peer device or other common network node, or the like. The communication interface 1135 may connect to a local-area network (LAN), a wide-area network (WAN), a cellular network, a WiFi network, a Bluetooth network, or other networks.

Computer instructions stored on a computer-readable medium (e.g., the program 1155 stored in the memory storage 1110) are executable by the processor 1105 of the computer 1100. A hard drive. CD-ROM, and RAM are some examples of articles including a non-transitory computer-readable medium such as a storage device. The terms "computer-readable medium" and "storage device" do not include carrier waves to the extent that carrier waves are deemed too transitory. "Computer-readable non-transitory media" includes all types of computer-readable media, including magnetic storage media, optical storage media, flash media, and solid-state storage media. It should be understood that software can be installed in and sold with a computer. Alternatively, the software can be obtained and loaded into the computer, including obtaining the software through a physical medium or distribution system, including, for example, from a server owned by the software creator or from a server not owned but used by the software creator. The software can be stored on a server for distribution over the Internet, for example.

The program 1155 is shown as including a design module 1160 and a place and route module 1165. Any one or more of the modules described herein may be implemented using hardware (e.g., a processor of a machine, an ASIC, an FPGA, or any suitable combination thereof). Moreover, any two or more of these modules may be combined into a single module, and the functions described herein for a single module may be subdivided among multiple modules. Furthermore, according to various example embodiments, modules described herein as being implemented within a single machine, database, or device may be distributed across multiple machines, databases, or devices.

The design module 1160 defines a design of a circuit (e.g., a processor, signal processor, compute engine, state machine, or controller circuit). For example, the design module 1160 may provide a user interface to allow a user to design a circuit.

The place and route module 1165 determines the physical layout of the resulting integrated circuit based on the circuit design defined by the design module 1160. For example, a design comprising one or more tiles with fused memory and arithmetic circuits may be laid out by the place and route module 1165 in order to be programmed into the FPGA configuration.

The Abstract of the Disclosure is provided to comply with 37 C.F.R. § 1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A circuit comprising:
   a first memory circuit operable to:
      receive an address input from a connection fabric of a field programmable gate array (FPGA), an intra-tile connection, or a cascade connection; and
      provide a first data output based on the address input;
   a second memory circuit operable to:
      receive the address input; and
      provide a second data output based on the address input; and
   a multiplexer operable to:
      receive a configuration input; and
      based on the configuration input, provide either the first data output or the second data output.

2. The circuit of claim 1, wherein:
   the first memory circuit is further operable to:
      receive a read enable signal;
      receive a data input; and
      based on the read enable signal, determine whether to write the data input to a memory location indicated by the address input.

3. The circuit of claim 1, further comprising:
   an arithmetic circuit configured to perform operations using the output provided by the multiplexer.

4. The circuit of claim 1, wherein:
   the address input is received from a connection fabric of a field programmable gate array (FPGA).

5. The circuit of claim 1, wherein:
   the address input is received from an intra-tile connection.

6. The circuit of claim 1, wherein:
   the address input is received from a cascade connection.

7. The circuit of claim 1, wherein:
   the output provided by the multiplexer is provided to the connection fabric of the FPGA.

8. The circuit of claim 1, wherein:
   the output provided by the multiplexer is provided to the intra-tile connection.

9. The circuit of claim 1, wherein:
   the output provided by the multiplexer is provided to the cascade connection.

10. The circuit of claim 1, wherein:
    the first memory circuit is a logic random access memory (LRAM).

11. The circuit of claim 1, wherein:
    the second memory circuit is a block random access memory (BRAM).

12. A method comprising:
    receiving, by a first memory circuit, an address input from a connection fabric of a field programmable gate array (FPGA), an intra-tile connection, or a cascade connection;
    providing, by the first memory circuit, a first data output based on the address input;
    receiving, by a second memory circuit, the address input;
    providing, by the second memory circuit, a second data output based on the address input;
    receiving, by a multiplexer, a configuration input; and
    based on the configuration input, providing, by the multiplexer, either the first data output or the second data output.

13. The method of claim 12, further comprising:
    receiving, by the first memory circuit, a read enable signal;
    receiving, by the first memory circuit, a data input; and
    based on the read enable signal, determining, by the first memory circuit, whether to write the data input to a memory location indicated by the address input.

14. The method of claim 12, further comprising:
    performing, by an arithmetic circuit, operations using the output provided by the multiplexer.

15. The method of claim 12, wherein:
    the address input is received from the connection fabric of the FPGA.

16. The method of claim 12, wherein:
    the address input is received from the intra-tile connection.

17. The method of claim 12, wherein:
    the address input is received from the cascade connection.

18. A non-transitory machine-readable medium containing instructions that, when executed by one or more processors, cause the one or more processors to configure a field programmable gate array (FPGA) to comprise:
    comprising:
    a first memory circuit operable to:
       receive an address input from a connection fabric of the FPGA, an intra-tile connection, or a cascade connection; and
       provide a first data output based on the address input;

a second memory circuit operable to:
  receive the address input; and
  provide a second data output based on the address input; and
a multiplexer operable to:
  receive a configuration input; and
  based on the configuration input, provide either the first data output or the second data output.

19. The non-transitory machine-readable medium of claim 18, wherein:
the first memory circuit is further operable to:
  receive a read enable signal;
  receive a data input; and
  based on the read enable signal, determine whether to write the data input to a memory location indicated by the address input.

20. The non-transitory machine-readable medium of claim 18, wherein the FPGA is further configured to comprise:
an arithmetic circuit configured to perform operations using the output provided by the multiplexer.

* * * * *

UNITED STATES PATENT AND TRADEMARK OFFICE
CERTIFICATE OF CORRECTION

PATENT NO. : 12,034,446 B2
APPLICATION NO. : 16/940878
DATED : July 9, 2024
INVENTOR(S) : Pugh et al.

Page 1 of 1

It is certified that error appears in the above-identified patent and that said Letters Patent is hereby corrected as shown below:

In the Specification

In Column 4, Line 44, delete "410A." and insert --410A,-- therefor

In Column 4, Line 45, delete "420A." and insert --420A,-- therefor

In Column 4, Line 46, delete "430B." and insert --430B,-- therefor

In Column 4, Lines 57-58, delete "[71:0]." and insert --[71:0],-- therefor

In Column 5, Line 15, delete "[71:0]." and insert --[71:0],-- therefor

In Column 9, Line 12, delete "830A." and insert --830A,-- therefor

In Column 12, Line 17, delete "Internet." and insert --Internet,-- therefor

In Column 12, Line 24, delete "1150:" and insert --1150;-- therefor

In Column 12, Line 25, delete "1115:" and insert --1115;-- therefor

In Column 12, Line 58, delete "drive." and insert --drive,-- therefor

In the Claims

In Column 12, Line 62, in Claim 18, after "comprise:", delete "comprising:"

Signed and Sealed this
Fourth Day of March, 2025

Coke Morgan Stewart
*Acting Director of the United States Patent and Trademark Office*